(12) United States Patent
Ozawa

(10) Patent No.: US 6,614,353 B2
(45) Date of Patent: Sep. 2, 2003

(54) CONSTANT-TEMPERATURE LIQUID CIRCULATING DEVICE HAVING A PROPORTIONAL VALVE BASED PREDICTIVE SYSTEM FOR PRE-ESTIMATING A NEED FOR MAINTENANCE

(75) Inventor: Toru Ozawa, Irvine, CA (US)

(73) Assignee: SMC Kabushiki Kaisha, Tokyo (JP)

( * ) Notice: Subject to any disclaimer, the term of this patent is extended or adjusted under 35 U.S.C. 154(b) by 62 days.

(21) Appl. No.: 10/043,100

(22) Filed: Jan. 14, 2002

(65) Prior Publication Data

US 2003/0132850 A1 Jul. 17, 2003

(51) Int. Cl.$^7$ .............................................. G08B 17/00
(52) U.S. Cl. ....................... 340/585; 340/501; 340/587; 62/196.4; 62/185; 137/487.5
(58) Field of Search ................................. 340/500, 501, 340/585, 584, 587, 588, 589, 686.1; 62/196.4, 185, 201, 434; 137/487.5, 551, 554

(56) References Cited

U.S. PATENT DOCUMENTS 5,619,861 A * 4/1997 Yamanaka et al. ............ 62/225
5,677,677 A * 10/1997 Duff et al. ................... 340/585
6,233,955 B1 * 5/2001 Egara ......................... 62/196.4

FOREIGN PATENT DOCUMENTS

| JP | 5-17535 | 5/1993 |
|---|---|---|
| JP | 11-37516 | 2/1999 |

OTHER PUBLICATIONS

Note: English language summaries and discussion of relevance of the Japanese citations appear in the present specification, on pp. 4–10.

* cited by examiner

Primary Examiner—Anh V La
(74) Attorney, Agent, or Firm—Paul A. Guss

(57) ABSTRACT

In a constant temperature liquid circulating apparatus, in order to determine parts and locations requiring maintenance work and maintenance time intervals before the occurrence of an irregular operation, so that any downtime in operation of a constant temperature liquid circulating apparatus is made as short as possible, a system is provided in which respective components of the apparatus are provided with sensors for use in monitoring various kinds of condition amounts in a continuous manner. Especially, among such components, a three-way proportional valve is provided between the outlet of a heat exchanger and an inlet to a holding tank, in a cooling liquid circulating circuit which supplies a constant temperature cooling liquid to a load, and a sensor is provided which detects a degree of valve opening of the three-way proportional valve. A trend line of the three-way proportional valve opening is monitored continuously, and when the trend line shows signs of rising above a certain valve opening percentage, such a tend is taken as an indication that the cooling capacity of the apparatus may be decreasing, and preventative measures are undertaken to investigate the cause of such irregular operation.

6 Claims, 7 Drawing Sheets

Prior Art

Prior Art

Prior Art

CONSTANT-TEMPERATURE LIQUID CIRCULATING DEVICE HAVING A PROPORTIONAL VALVE BASED PREDICTIVE SYSTEM FOR PRE-ESTIMATING A NEED FOR MAINTENANCE

BACKGROUND OF THE INVENTION

1. Field of the Invention

The present invention concerns an alarm or warning system for predictive maintenance, in a constant temperature liquid circulating apparatus which supplies a constant temperature cooling liquid to a load in accordance with operation of a three-way proportional valve.

2. Description of the Related Art

In various kinds of mechanical devices having constant temperature components, for example in the case of a semiconductor processing apparatus, a constant temperature cooling liquid (typically a brine solution) is continuously supplied to the constant temperature component (load) of the apparatus, wherein it is necessary to maintain a fixed temperature at the load. For this purpose, a constant temperature liquid circulating apparatus (also known as a "chiller" unit) is provided for supplying a constant temperature cooling liquid, wherein the cooling liquid which has risen in temperature by the load is circulated back to the constant temperature liquid circulating apparatus and, after being chilled by contact with a refrigerant in a heat exchanger, heat is then applied to the cooling liquid from a heater to establish a fixed temperature for the cooling liquid, and the cooling liquid is resupplied to the load in a circulatory manner.

The constant temperature liquid circulating apparatus, as understood from the description above, is not only for connection to a semiconductor processing apparatus, but may also be connected to other mechanical or electrical devices (master devices) in various industrial areas for which temperature control is required for supporting their proper operation. Therefore, breakdown or irregular operation of the constant temperature liquid circulating apparatus is directly related to stoppage of the master apparatus to which it is attached, with the possibility of creating large scale failure and loss.

More specifically, the constant temperature liquid circulating apparatus generally comprises a refrigeration circuit for cooling, in a heat exchanger, the cooling liquid that is returned from the load, and a cooling liquid circulating circuit for adjusting to a fixed temperature by applied heating the cooling liquid which has been chilled in the heat exchanger, and discharging the same, as well as other operating equipment therefor. The structural elements making up the aforementioned refrigeration circuit and cooling liquid circulating circuit, and the operating equipment therefor, are made up of a large number of parts. Even if one of the structural parts develops a fault, there is not only the possibility for breakdown or irregular operation of the constant temperature liquid circulating apparatus itself, but irregular operation or operational stoppage of the master device attached thereto may also occur, and in extreme cases, may cause a complete breakdown of the master device itself.

Accordingly, it is necessary to consider how to avoid irregular conditions in such a constant temperature liquid circulating apparatus, while at the same time is it very important to take preventative safety measures before such irregular conditions arise. However, when the constant temperature liquid circulating apparatus is used, there is a tendency, from the standpoint of rising costs, not to continuously perform careful observation thereof. Moreover, even when observations of the apparatus are regularly made, it is not possible to avoid natural wear and tear of parts which occur with the passage of time, and as a result, the useful life of the parts, and natural breakdown thereof, cannot be avoided. Thus, so called post-event processing, that is, methods for investigating the cause only after an irregular condition has occurred in the constant temperature liquid circulating apparatus, with exchange of parts and the like, have been required. With such methods, however, the time for restoration of the apparatus is lengthened, and large scale losses can occur.

As one system which attempts to deal with this type of problem, a so called "remote maintenance" system is known. This system is one in which the running state of an apparatus is observed using various kinds of sensors, and when a breakdown or irregular condition occurs, information about the state of the apparatus is transmitted to a predetermined location using telephone lines, so that service personnel can be quickly dispatched for conducting repairs. Notwithstanding, this system also involves post-event processing in which repair work is not begun until after the constant temperature liquid circulating apparatus develops a breakdown or irregular condition, wherein required repairs can be hastened only to a certain extent.

In order to address some of the problems indicated above, one approach has been proposed as described in Japanese Laid-Open Patent Publication No. 11-37516. This system attempts to minimize apparatus downtime by inferring the parts which require maintenance, and time intervals at which maintenance therefor is needed, in a constant temperature liquid circulating apparatus before the occurrence of an irregular condition.

As shown in FIG. 5, such a constant temperature liquid circulating apparatus is made up of a refrigeration circuit and a cooling liquid circulating circuit. The refrigeration circuit comprises a compressor 61, a condenser 62, a pressure-reducing valve 63, an evaporator 64 and an accumulator 65, all of which are connected in series. The refrigeration circuit section also includes an overheat prevention circuit 66 that directly returns the compressed refrigerant to an accumulator 65 when the evaporator 64 is subjected to a large load, including an overheat prevention valve 66a in the circuit 66 that opens and closes the overheat prevention circuit 66 based on readings from a temperature sensor 66b located on the upstream side of the accumulator 65 for detecting the temperature of the refrigerant.

On the other hand, the cooling liquid circulating circuit comprises a heat exchanger 71, in which heat exchange occurs between the refrigerant and the cooling liquid that is circulated back after having risen in temperature by the load, a cooling liquid tank 72 having a heater 73 installed therein, and a pump 74 which supplies and circulates the cooling liquid to the load which has been heated to a fixed temperature by the heater 73, all of which are interconnected in series.

As a result, the cooling liquid which has risen in temperature by the load is chilled by the refrigerant of the refrigeration circuit which flows through the evaporator 64 arranged in the heat exchanger 71.

In addition, a temperature sensor 75 that detects the temperature of the cooling liquid and outputs a signal thereof is provided near an outlet of the tank 72, and a temperature controller 76 is installed in the circulating circuit section to control the amount of power supplied to the heater 73 based on the output signal from the temperature sensor 75. The temperature controller 76 compares the temperature detected by the temperature sensor 75 with a set temperature for the cooling liquid in order to control the amount of power supplied to the heater 73, i.e., the amount of heat provided in the tank 72.

Such a constant temperature liquid circulating apparatus includes a predictive maintenance system which comprises additional sensors for continuously monitoring various condition amounts, the sensors being provided at respective components of the apparatus. From the condition amounts of the apparatus which are obtained as outputs of the sensors, internal components and parts requiring maintenance, and maintenance time intervals therefor, are inferred. Further, a warning means 81 is also provided for issuing a warning when a warning condition exists, but before a serious irregular condition or breakdown actually takes place.

More specifically, in this predictive maintenance system, as sensors for continuously monitoring various types of conditions, sensors for detecting changes in condition amounts including the temperatures of various components, electrical current amounts for electrically operated driving parts, refrigerant pressure, cooling liquid flow amounts, and the like, may be set up in the constant temperature liquid circulating apparatus. Further, the warning means 81 is provided for inferring which parts require maintenance, along with maintenance time intervals therefor, and for issuing a warning from changes in condition amounts of the various internal parts of the apparatus that are obtained as outputs from the sensors. Or, as the aforementioned sensors, sensing means may be provided within the constant temperature liquid circulating apparatus for detecting accumulated amounts of the number of ON/OFF times of mechanical parts including valves, and/or current supply time intervals to the heater, wherein a warning means is provided for inferring the parts which require maintenance and maintenance time intervals therefor, and for issuing a warning from changes in the condition amounts of the various internal parts of the apparatus that are obtained as outputs from such sensors.

Thus, unlike post-event processing that takes place only after detection of a breakdown or irregular condition, a warning can be issued from the warning means 81 before occurrence of a breakdown or irregular condition, so that timely maintenance thereof can be urged. The warning is not only provided on an operational display part of the constant temperature liquid circulating apparatus itself, but in addition may be applied to an operational display part of a master device or in a control room. Further, Laid-Open Publication No. 11-37516 indicates that warning indications may be transmitted to a remote location via telephone lines. As a result, parts requiring maintenance and maintenance time intervals therefor are inferred prior to the occurrence of an irregular condition, so that the downtime of the apparatus can be minimized.

An example of operation of the aforementioned known predictive maintenance system is shown in FIGS. 6(A) and 6(B). A time-wise variation of the cooling capacity is detected based on the temperature data obtained from the temperature sensor 75 disposed in a cooling liquid circulating tank 72, and an irregular operational condition is judged from such a variation. First, in the constant temperature liquid circulating apparatus, the cooling capacity data (output from the cooling liquid temperature sensor 75) possesses a normal characteristic as shown typically in FIG. 6(A). When a fault or irregular condition is beginning to appear, such a characteristic tends to change as shown in FIG. 6(B). More specifically, a change in the characteristic occurs wherein the temperature variation period of the cooling liquid (i.e., the length of time it takes for the temperature to change,) expands from T1 to T2.

When the temperature data is obtained as shown in FIGS. 6(A) and 6(B), in an arithmetic control unit which makes up the warning means 81, a judgement is made and an alarm or warning is issued, whereby the need for maintenance of the constant temperature liquid circulating apparatus can be pre-estimated. Further, in the case that the data detected by other sensors deviates from their proper value ranges, exceeding an upper or lower limit at which an irregular condition is possible, or in the case of deviation from a judgement standard for judging irregular operation, or further in the case that the number or ON/OFF times of mechanical operating parts exceeds an operational limit, or if the usage time of the heater or other expendable parts exceeds a limit value, a warning may be issued according to a similar sort of judgement.

However, in the apparatus shown in FIG. 5, in order to control the temperature of the cooling liquid in the tank 72, after chilling of the cooling liquid through contact with the evaporator 64 in the heat exchanger 71, heat is then applied to the cooling liquid. That is, after cooling in excess of a predetermined temperature, it is necessary to apply heat to the cooling liquid using the heater 73. Thus, chilling of the cooling liquid and subsequent heating are handled using separate operations which tends to result in wasting of energy.

In order to address such a problem, according to Japanese Utility Model Disclosure Document No. 5-17535, a temperature control apparatus has been proposed in which it is possible to control temperature over a wider temperature range with higher precision, and moreover, in which energy consumption is lower. Such an apparatus, as shown in FIG. 7, is characterized by a refrigeration circuit and cooling liquid circulating circuit similar to that shown in FIG. 5, but wherein the cooling liquid circulating passage further comprises an auxiliary coolant path 78 which branches from an outlet side of the pump 74, and then passes through an ON/OFF type of electromagnetic valve 79 and the heat-exchanger 61, providing fluid transport in a recirculating manner back to the tank 62. Further, the temperature controller 76 causes the ON/OFF type electromagnetic valve 79 to open when the temperature of the cooling liquid in the tank 72 is higher than a preset temperature, and causes electricity to be supplied to the heater 73 when the cooling liquid temperature falls below a preset temperature.

The basic operation of the this known type of apparatus may be described as follows. In a case in which the temperature of the cooling liquid in the tank 72 is higher than a preset temperature, the ON/OFF electromagnetic valve 79 is opened by the temperature controller 76, so that the cooling liquid which flows through the auxiliary coolant flow path 78 is chilled by the heat exchanger and quickly recirculates back to the tank 72. In the case that the cooling liquid temperature becomes lower than a preset temperature set in the temperature controller 76, the ON/OFF electromagnetic valve 79 is closed together with applying heat from the heater 73, so that the temperature of the cooling liquid in the tank 72 can be maintained inside the preset temperature range of the temperature controller 76.

Because cooling of the cooling liquid in the auxiliary coolant path 78, as well as application of heat by the heater 73, is selectively performed by raising and lowering the cooling liquid temperature with respect to the preset temperature range, compared to the case of applying heat by a heater to a previously-cooled cooling liquid for controlling to a set temperature range, consumption of energy can be lessened overall, while notwithstanding, the temperature control is highly accurate. Further, by selectively cooling and applying heat to the cooling liquid, control over a wider temperature range is made possible.

However, the apparatus according to Japanese Utility Model Disclosure Document No. 5-17535 has experienced problems of its own. In particular, this apparatus uses an electromagnetic ON/OFF type valve 79 and a heater 73, making up an ON/OFF system, which enables temperature control over a wide range from about −20° C. to +90° C. However, because of use of the ON/OFF type of electromagnetic valve 79, during abrupt ON/OFF switching operations of the electromagnetic valve, an undesirable "water hammer" effect has been generated. The problem is all the more aggravated in the case of large capacity chiller units, resulting in a cumbersome and vexing disadvantage which has yet to be fully solved. Because of the water hammer effect, it has not been possible to implement this system in large capacity chiller units.

SUMMARY OF THE INVENTION

An object of the present invention is to overcome the problems of the water hammer effect and to enable operation of a predictive maintenance system in larger capacity chiller units.

To accomplish this aim, and in order to determine parts and locations requiring maintenance work and maintenance time intervals before the occurrence of an irregular operation, so that any downtime in operation of the constant temperature liquid circulating apparatus is made as short as possible, a system according to the present invention is provided in which respective components of the apparatus are provided with sensors for use in monitoring various kinds of condition amounts in a continuous manner. Especially, among such components, a three-way proportional valve is provided between the outlet of a heat exchanger and inlet to a holding tank, in a cooling liquid circulating circuit which supplies a constant temperature cooling liquid to a load, and a sensor is provided which detects a degree of opening of the three-way proportional valve. A trend line of the three-way proportional valve opening is monitored continuously, and when the trend line shows signs of rising above a certain valve opening degree, such a tend is taken as an indication that the cooling capacity of the apparatus may be decreasing, and preventative measures are undertaken to investigate the cause of such irregular operation.

The above and other objects, features and advantages of the present invention will become apparent from the following description when taken in conjunction with the accompanying drawings in which a preferred embodiment of the present invention is shown by way of illustrative example.

DETAILED DESCRIPTION OF THE PREFERRED EMBODIMENTS

Figure 1:
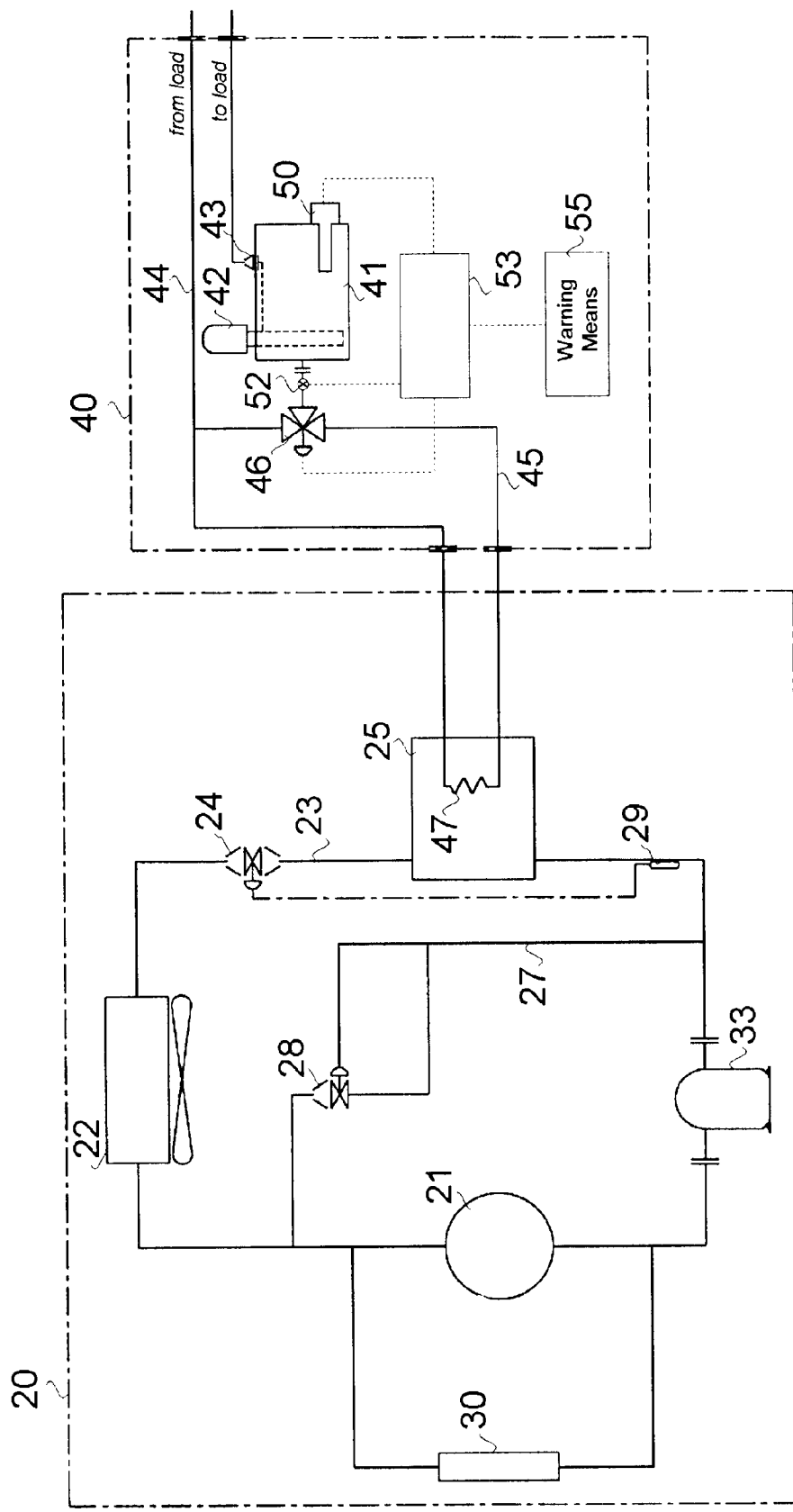
FIG. 1 is a block diagram of a constant temperature liquid circulating apparatus equipped with a predictive maintenance system, and operating on the basis of a three-way proportional valve, in accordance with the present invention.

FIG. 1 shows an example of a constant temperature liquid circulating apparatus which can be equipped with the predictive maintenance system according to the present invention. The constant temperature liquid circulating apparatus (commonly referred to as a "chiller" unit) is essentially an apparatus for circulating and continuously supplying a constant temperature cooling liquid medium (typically brine) with respect to a constant temperature member (load) in various kinds of mechanical or electrical devices, and primarily comprises a cooling liquid circulating circuit 40 in which the cooling liquid that is returned back from the load is cooled in a heat exchanger 25, the circulating circuit then passing through a tank 41 having a heater 50 in which the chilled cooling liquid is adjusted to a fixed temperature by application of heat and discharged therefrom.

Various types of equipment operated in conjunction with the constant temperature liquid circulating apparatus may also be included. For example, an activation switch, a temperature setting device for setting the temperature of the cooling liquid, an input/output display device including an operational display for displaying a present operating state, a sequencer for providing sequential operation or various controls, and various other electrical devices may also be provided.

FIG. 1 shows an embodiment of the present invention in which the cooling liquid temperature control apparatus comprises a refrigeration circuit 20 and a cooling liquid circulating circuit 40 respectively.

The above-noted refrigeration circuit 20 is equipped with a compressor 21, a condenser 22, and a temperature-type expansion valve 24 disposed in series along a refrigerant medium circuit 23 including a heat exchanger 25. A hot gas bypass conduit 27 is provided into which a hot gas that is compressed by the compressor 21 can flow, bypassing the condenser 22 and expansion valve 24 when the compressor 21 is operating under certain load conditions or upon startup, as is well understood in the art. The degree of opening of the aforementioned temperature-type expansion valve 24 is controlled by a temperature sensing bulb 29. Driving of the compressor 21 is controlled by a high/low pressure switch 30, and the flow amount of hot gas flowing through the flow path 27 is controlled by a capacity adjusting valve 28, respectively. An oil separator 33 comprising a suction tank is also provided in a known manner.

The aforementioned cooling liquid circulating circuit 40 is equipped with a main flow path 44 in which a tank 41, a pump 42 and a load (not shown) are connected successively in series, and an auxiliary coolant flow path 45 which branches off from a return line from the load for recirculating the cooling liquid through the heat exchanger 25 and back to the tank 41. A three-way proportional valve 46 and a heat exchange member 47 which undergoes heat exchange with the refrigerant of the refrigeration circuit 20 in the heat exchanger 25 are disposed in series in the auxiliary coolant flow path 45. A level regulating valve 43 is also provided which controls the supply of cooling liquid to the load while keeping the level of cooling liquid in the tank 41 substantially constant.

The condenser 22 is illustrated in FIG. 1 as a fan cooled condenser unit, although it will be appreciated that the condenser 22 could also be cooled using cooling water supplied from an external cooling tower (not shown).

The three-way proportional valve 46 operates such that the amount of chilled cooling liquid which is introduced into the tank 41, after being chilled by circulating through the heat exchanger 25 in the auxiliary coolant flow path 45, can be varied proportionally to a temperature amount detected by the temperature sensor 52. The side of the three-way proportional valve 46 through which chilled cooling liquid is introduced can be operated over a range from being completely closed (0%), wherein freshly chilled cooling liquid is not introduced into the tank 41, to being completely open (100%), wherein substantially all of the cooling liquid returned from the load is circulated through the heat exchanger 25 and chilled therein before returning to the tank 41. Typically, under normal operating conditions, the average degree of opening of the three-way proportional valve 46 is about 60%.

The tank 41 has a heater 50 for applying heat to the cooling liquid, wherein a degree of opening of the three-way proportional valve 46, and supply and cutoff of electricity to the heater 50, are controlled by a temperature controller 53 operated by a signal from a temperature sensor 52 that detects the temperature of the cooling liquid supplied to the tank 41. In the case that the temperature of the cooling liquid supplied to the tank 41 becomes higher than a preset temperature, as set in the temperature controller 53, the three-way proportional valve 46 is opened for supplying chilled cooling liquid to a greater degree along with suspending the supply of electricity to the heater 50, whereby the cooling liquid is cooled. In the case that the supplied cooling liquid becomes lower than the preset temperature, the degree of opening of the three-way proportional valve 46 is lessened so that the amount of chilled cooling liquid introduced into the tank is decreased, along with supplying electricity to the heater 50, whereby the cooling liquid is heated. When the cooling liquid is determined to reside at the preset temperature, the degree of opening of three-way proportional valve 46 is not changed and the heater 50 is deactivated, so that rise or fall of the cooling liquid temperature is halted.

Next, the operation of the above-described embodiment shall be discussed.

In the refrigeration circuit 20, operation of the compressor 21 is regulated by a high/low pressure switch 30. Hot gas flows through the hot gas bypass conduit 27 for preventing freezing of the cooling liquid at a low temperature side of the heat exchanger 25 and is adjusted by a capacity adjusting valve 28. Further, control of an evaporation temperature of the heat exchanger 25 is performed by controlling a degree of opening of the temperature-type expansion valve 24 in accordance with a temperature sensing bulb 29.

On the other hand, cooling liquid which flows through a main flow passage 44 of the cooling liquid circulating circuit 40 receives heat or releases heat at the load (not shown) and recirculates to the tank 41, whereby the variable temperature of the cooling liquid supplied to the tank 41 is detected by the temperature sensor 52.

In the aforementioned temperature controller 53, as the temperature of cooling liquid supplied to the tank 41 and detected by the temperature sensor 52 progressively rises inside of a preset temperature range set by the temperature controller 53, the degree of opening of the three-way proportional valve 46 for supplying chilled cooling liquid to the tank 41 is increased proportionally to the temperature rise. Thus, after the cooling liquid flowing through the auxiliary coolant flow path 45 is cooled in the heat exchange portion 47 of the heat exchanger 25, the chilled cooling liquid is circulated back to the tank 41, whereby the temperature of the cooling liquid inside the tank 41 falls in temperature to remain inside the preset temperature range. Conversely, as the temperature of the supplied cooling liquid decreases within the preset temperature range, the degree of opening of the three-way proportional valve 46 is decreased, while in addition, electricity is supplied to the heater 50, whereby the temperature of the cooling liquid inside the tank 41 rises to remain within the preset temperature range. When it is already at the preset temperature, the degree of opening of the three-way proportional valve 46 is not changed and supply of electricity to the heater 50 is halted, so that the rise or fall of temperature of the cooling liquid is stabilized.

In the aforementioned constant temperature liquid circulating circuit, for predicting a need for maintenance ahead of an event, at respective parts throughout the apparatus, sensors are disposed for continuously monitoring various condition amounts. As such sensors, there can be disposed at necessary points in the constant temperature liquid circulating apparatus the following types of sensors: temperature sensors for detecting the temperature of respective parts of the refrigeration circuit and the circulating circuit; current sensors for detecting the current values of driving motors for the compressor 21 and pump 42 and of other electrically actuated parts; pressure sensors for detecting pressures of the refrigerant and the cooling liquid in respective locations of refrigerant and cooling liquid flow passages of the refrigeration circuit and the circulating circuit; flow amount sensors for detecting flow amounts of the cooling liquid in the coolant flow path of the circulating circuit, as wells as various sensors for detecting changes in effective condition amounts for predicting other irregular conditions of the constant temperature liquid circulating apparatus. Further, as the above sensors, other sensing means may also be used such as the following: calculators for calculating operation cycles of mechanical operating parts including the electromagnetic valves used in the refrigeration circuit and the circulating circuit; an accumulating device for determining additive values of electric supply times to the heater 50; and an accumulating device of the usage time intervals for detecting that the useful life of various expendable parts has been reached.

The condition amounts of the apparatus internal parts that are obtained as outputs of the sensors which are arranged in the constant temperature liquid circulating apparatus are transmitted to a warning means 55 which is disposed at any optional location. In FIG. 1, for example, the warning means 55 is shown as being associated with the temperature controller and receives signals therefrom, which may include, in particular, a signal indicating a degree of valve opening of the three-way proportional valve 46, as shall be discussed in more detail later.

The warning means 55 also receives signals from other sensors throughout the apparatus. Specifically, the warning means 55 is formed by an arithmetic control unit which infers the parts for which maintenance is required, and maintenance time intervals therefor, based on condition amounts obtained from the various sensors or from variations of the condition amounts, and issues a needed warning before a breakdown or irregular condition is reached. As a result, it is necessary to store beforehand in the warning means 55 proper value ranges concerning the respective data detected by the temperature sensors, current sensors, pressure sensor and flow sensors, or upper and lower value limits at which irregular operation becomes likely, or otherwise to store standards for judging irregular conditions. The operational limiting cycles of mechanical operating parts, limiting values for electrical supply times of the heater, or usage time intervals of expendable parts, or the like, are also handled similarly.

In the predictive maintenance system having the above-described structure, as a result of sensors which detect various condition amounts including temperatures at each of the internal parts of the constant temperature liquid circulating apparatus, electric current values of electromagnetic actuators, pressures of the refrigerant and cooling liquids and flow rates of the cooling liquid, or the like, or from sensors that detect the number of times of operation of mechanical operating parts including valves, and cumulative amounts of electric supply times to the heater or the like, various condition amounts are monitored. Based on the sensor outputs therefrom, locations at which maintenance is needed and maintenance time intervals are inferred in the warning means 55. So called after-event responses which take place only after a breakdown or serious irregular condition of the constant temperature liquid circulating apparatus are not taken, but rather warnings are issued before such breakdowns or irregular conditions actually occur, wherein the need for maintenance from an operator or service personnel is urged. At that time, of course, the detected data from the devices can be directly recorded on a recording medium such as a floppy disk. Such a warning is not only provided on the operating display unit of the constant temperature liquid circulating apparatus, but a display by means of a lamp, warning sound, characters or the like can be provided on the operational display of a master device or in a control room, and further, by means of telephone lines, or via a distributed wire or wireless network, intranet or internet, may be transmitted to a maintenance facility for establishing the warning at a remote site.

Of particular importance to the present invention is to detect the degree of opening of the three-way proportional valve 46 which is disposed in the cooling liquid circulating path and which serves to control the flow amount of chilled cooling liquid output from the heat exchanger 25 to the tank 41. As shall be described below, an overall rising trend in degree of opening of the three-way proportional valve 46 can serve to indicate a decrease in cooling capacity of the cooling liquid circulating circuit.

The degree of opening of the three-way proportional valve 46, and in particular a rising trend in an average degree of opening thereof, serves as a valuable indicator of cooling capacity in accordance with the teachings of the invention, which shall be described below in connection with FIGS. 2 and 3.

Figure 2:
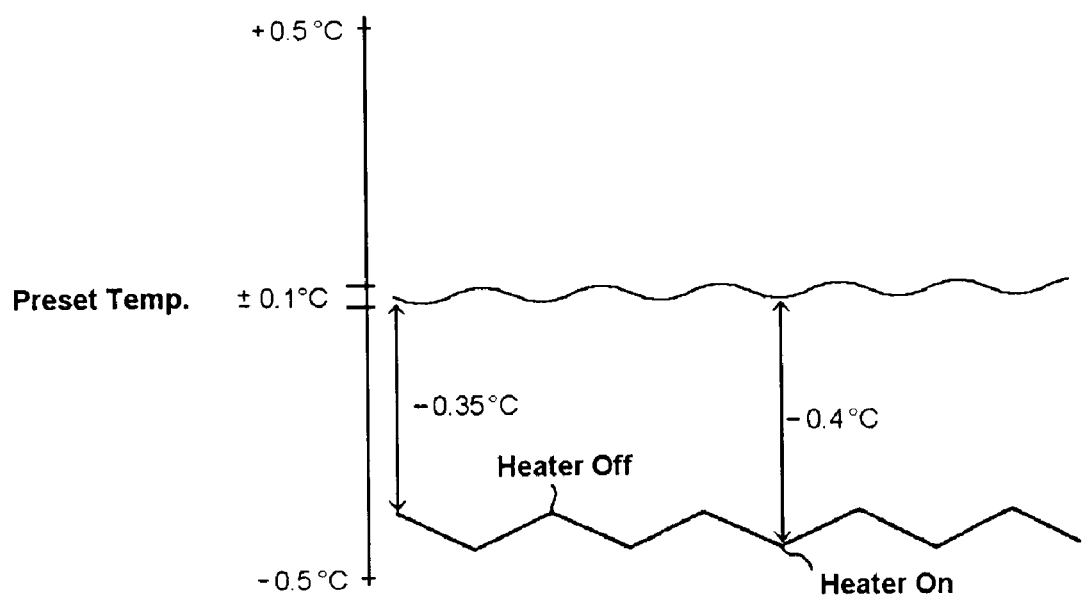
FIG. 2 shows operational results and effects of the temperature control apparatus for maintaining cooling liquid temperature, along with heater operation, in a cooling liquid flow path, according to the teachings of the present invention.

FIG. 2 shows operational results and effects of the temperature control apparatus of the above-described embodiment. When the cooling liquid inside of tank 41 rises (i.e. progressively increases), the degree of opening of the three-way proportional valve 46 on the side for supplying chilled cooling liquid increases in proportion to the detected cooling liquid temperature, thereby cooling the cooling liquid. Conversely, the degree of opening of the three-way proportional valve 46 decreases as the detected cooling liquid temperature is lowered below the preset temperature, for reducing the supply of chilled cooling liquid and allowing the temperature of the cooling liquid in the tank 41 to increase.

More specifically, the wavy line in the upper half of FIG. 2 is intended to illustrate controlled cooling liquid temperature in a generalized case in which the temperature of the cooling liquid is relatively stable and fluctuating in a sinusoidal pattern at or around the preset temperature. Under normal operation, the average degree of opening of the three-way proportional valve 46 for supplying chilled cooling liquid into the tank 41 is about 60%. As the cooling liquid temperature increases, the degree of opening of the three-way proportional valve 46 also increases (indicated by rising portions of the wavy line), while conversely, as the cooling liquid temperature decreases, the degree of opening of the three-way proportional valve 46 decreases (indicated by falling portions of the wavy line). It should be understood, however, that different and less regular fluctuations in temperature of the cooling liquid are not only possible but likely, in which case the pattern of opening and closing of the three-way proportional valve would not be sinusoidal.

Further, as shown in FIG. 2, if the temperature of the cooling liquid decreases to be about 0.4° C. below the preset temperature, electricity is supplied to the heater 50 to supply supplemental heating to the cooling liquid to elevate its temperature to the range in which the three-way proportional valve is operating on its own. When the cooling liquid temperature reaches about 0.35° C. below the preset temperature, the supply of electricity is halted, although the temperature of the cooling liquid will continue to rise for a time after the heater is cut off. It should further be noted that when the heater is operating the three-way proportional valve can be completely closed to enable the cooling liquid temperature to recover to the preset temperature more quickly.

As a result, the temperature of cooling liquid inside the tank 41 can be controlled with high precision within a narrow range of about ±0.1° C. around the preset temperature.

Figure 3:
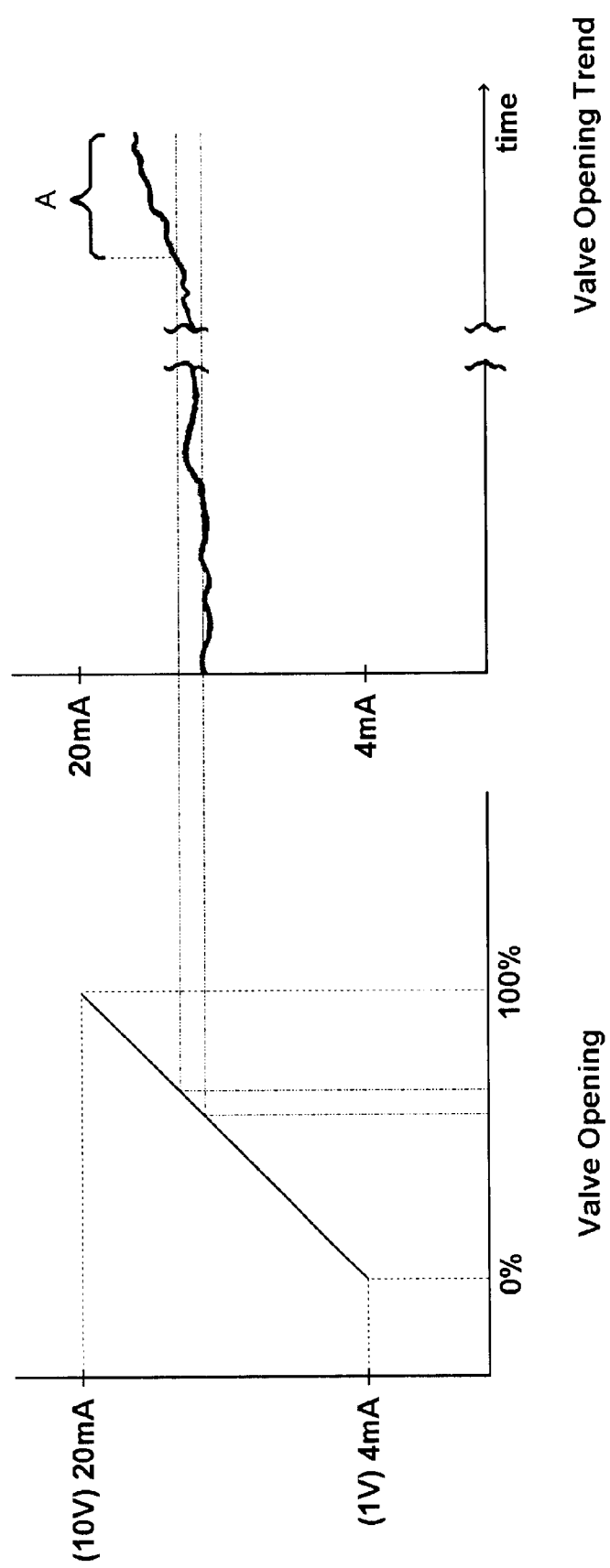
FIG. 3 is an explanatory view showing a trend line in the degree of opening of a three-way proportional valve used for modulating the flow of a cooling liquid.

By contrast, when the cooling capacity of the constant temperature liquid circulating apparatus begins to show signs of decreasing, the three-way proportional valve 46 reacts in such a manner that the average degree of opening of the three-way proportional valve 46 needed to maintain the same temperature of the cooling liquid supplied to the tank 41 tends to increase, as shown in FIG. 3. This happens because, as the cooling capacity of the refrigeration circuit decreases (which may be due to a refrigerant leak or other causes requiring investigation to determine), the temperature controller 53 senses an increase in temperature at the temperature sensor 52 and in response thereto sends a signal for opening the three-way proportional valve 46 to a greater degree. Although the opening of the three-way proportional valve 46 continues to fluctuate as described above, the average opening degree of the three-way proportional valve 46 exhibits an increasing trend above the normal 60% operation as shown in FIG. 3, wherein such a trend can be an indicator that the cooling capacity is decreasing.

More specifically, as shown in FIG. 3, according to the present invention a signal which indicates an opening degree of the three-way proportional valve 46 is registered, in the warning means 55, and from such a signal the actual degree of opening of the valve 46 is determined, and the cooling capacity of the apparatus is judged from the opening degree of the three-way proportional valve 46. Specifically, if the opening degree increases further than the expected opening degree needed for maintaining the same cooling of the liquid supplied to the tank 41, then a judgement is made that the cooling capacity of a apparatus has decreased.

The temperature controller 53 is typically operated such that when a 1V to 10V DC signal, over a range of 4 mA to 20 mA, is supplied to the three-way proportional valve 46, the valve is operated to open from between 0% and 100%, as shown on the lefthand side of FIG. 3. When such a signal indicative of the valve opening is registered, with respect to the same cooling capacity, so long as the opening degree of the valve is about 60% (i.e., within the range of the two-dot-dashed lines on the right side of FIG. 3), then the cooling capacity of the apparatus is judged to be acceptable. However, if in order to achieve the same cooling, the degree of opening of the three-way proportional valve rises above a preset limit (for example 75% or above, shown by region A), then it can be predicted that the cooling capacity of the apparatus is declining, which indicates a need for investigation and repair.

Moreover, as understood by comparing FIGS. 2 and 3, it is not possible to determine a diminishing in cooling capacity of the chiller unit simply by observing the temperature fluctuation of the cooling liquid alone, as shown by the wavy line in FIG. 2. This is because as the cooling capacity decreases, the degree of opening of the proportional valve is increased to compensate and maintain the temperature of the cooling liquid at or around the preset temperature. Stated otherwise, even as the cooling capacity of the chiller unit decreases, the temperature fluctuation will remain substantially as shown in FIG. 2. In such a case, although the wavy line in FIG. 2 does not change, the trend line in degree of opening of the three-way proportional valve changes significantly, as shown in FIG. 3.

Figure 4:
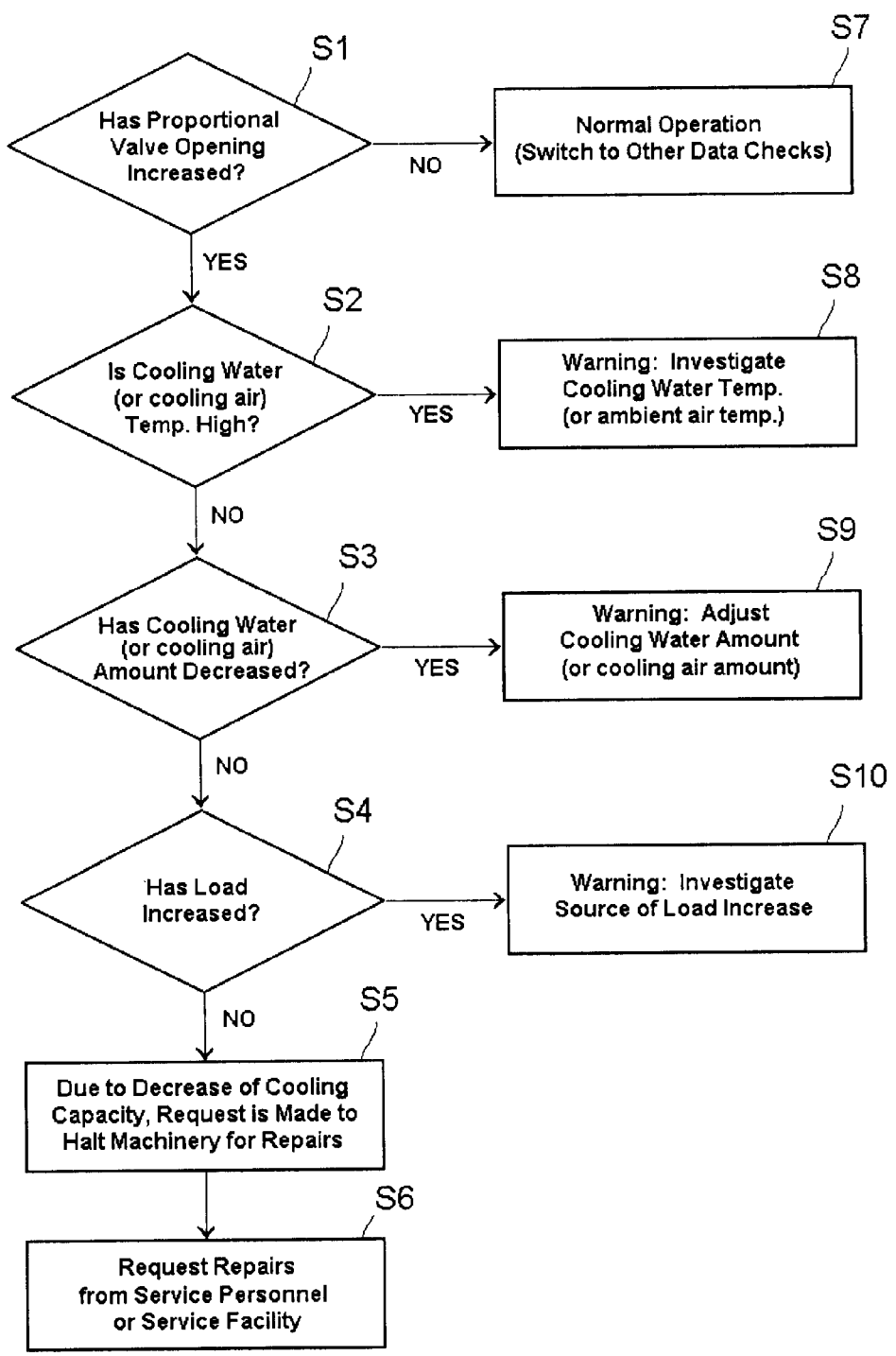
FIG. 4 is a flowchart of a warning routine, according to operations of the temperature controller and warning means shown in FIG. 1, when a warning condition is judged.
Figure 5:
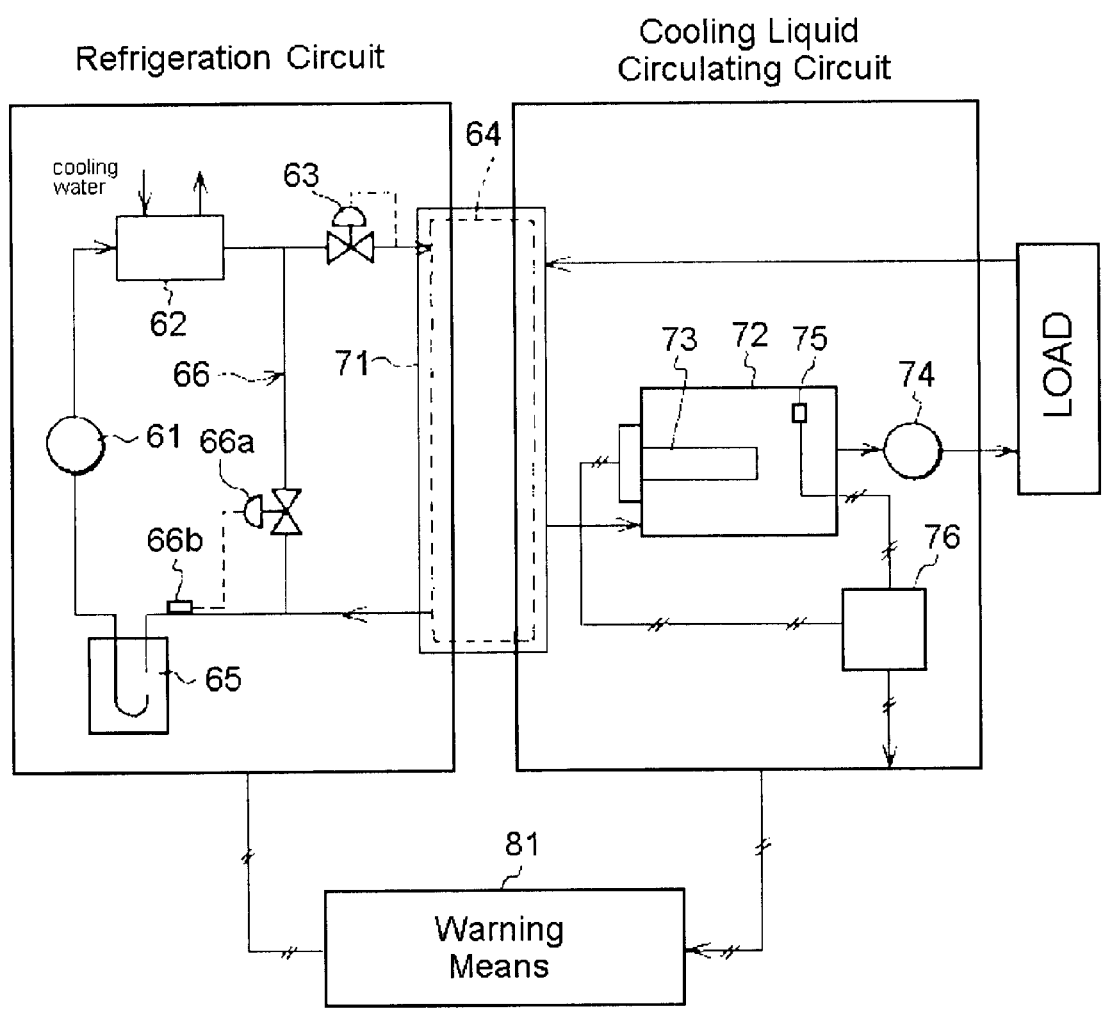
FIG. 5. is a block diagram of a constant temperature liquid circulating apparatus having a predictive maintenance system according to a conventional technique.
Figure 6:
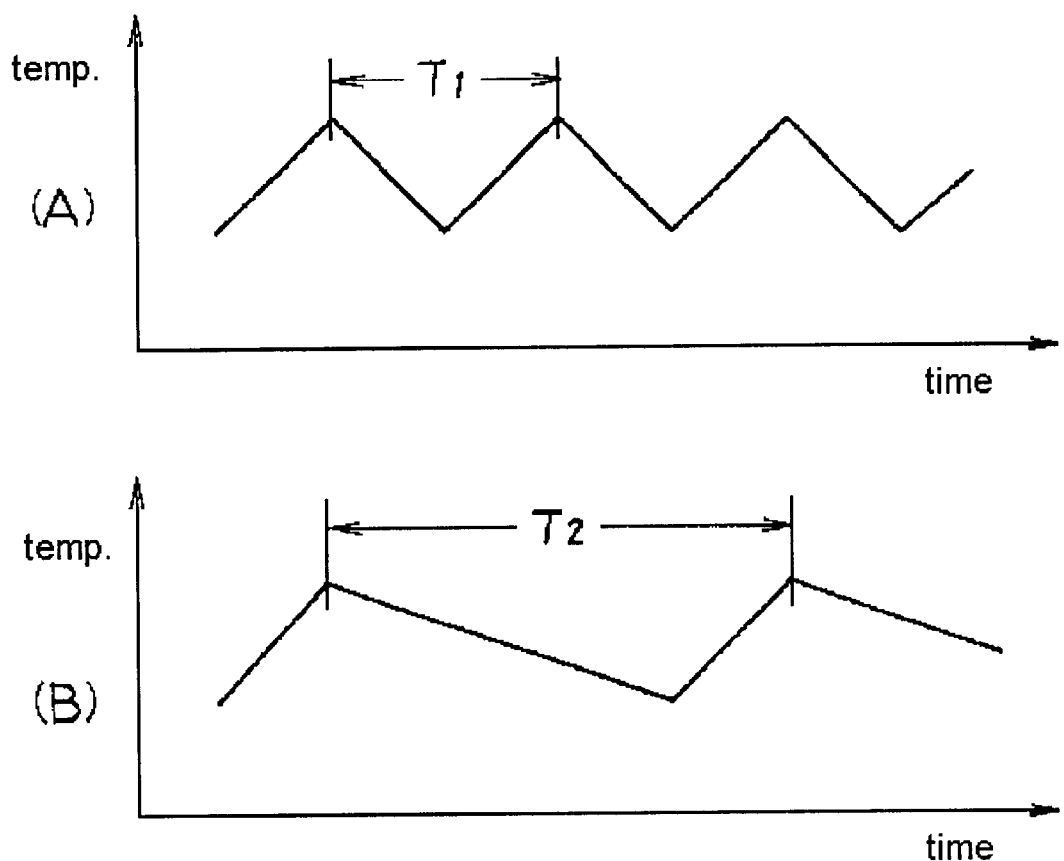
FIG. 6(A) and FIG. 6(B) are explanatory views showing typical variations in the output of a temperature sensor, in accordance with the known type of predictive maintenance system implemented in the conventional apparatus shown in FIG. 5.
Figure 7:
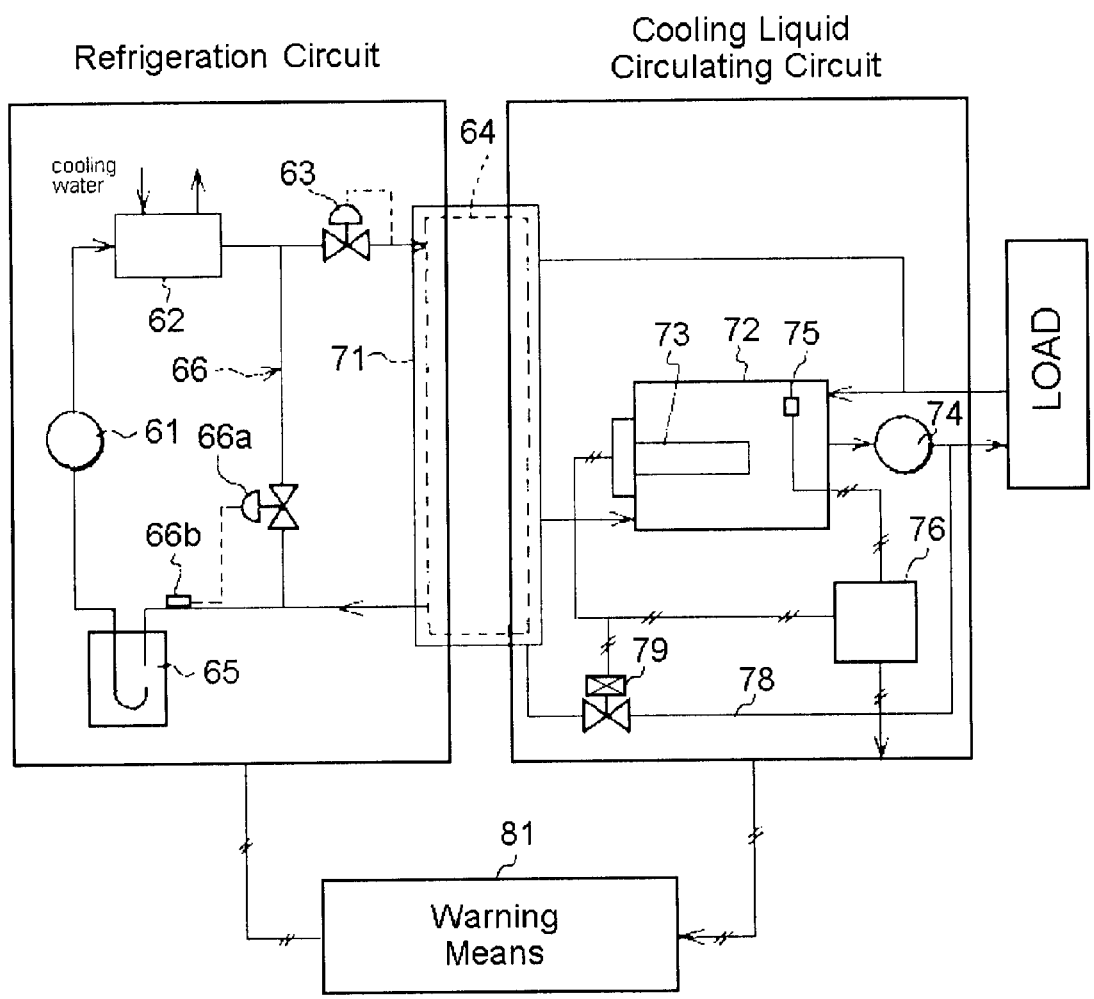
FIG. 7 is a known modification to the constant temperature liquid circulating apparatus shown in FIG. 5, including an auxiliary cooling liquid path operated using an ON/OFF electromagnetic valve.

In order to more accurately assess the cause of a particular irregular operation of the constant temperature liquid circulating apparatus, various warnings are issued and a procedure is undertaken by the warning means 55 as shown in FIG. 4. More particularly, FIG. 4 is a flowchart of a case in which a warning condition is judged, in accordance with a warning procedure in response to changes in the average opening degree of the three-way proportional valve 46.

Referring to FIG. 4, in Step S1 it is first determined whether the three-way proportional valve 46 shows a trend of having an average degree of opening of above, for example, 75% and rising. If the answer is NO, the warning means 55 determines that, insofar as the three-way proportional valve 46 is concerned, the system is operating normally, although the system may proceed to implement other data checks in Step S7 pertaining to other sensors installed throughout the apparatus. On the other hand, if the answer is YES in Step S1, the routine proceeds to investigate the cause of the irregularity and to issue appropriate predictive warnings.

For example, in Step S2, the system checks whether or not the cooling water or cooling air from a fan supplied to the condenser unit 22 is unusually high. If the answer to this query is YES, a warning is issued in Step S8 to an operator or to a remote maintenance facility to investigate the status of the cooling water (e.g., the condition of the cooling tower) or the ambient air temperature (e.g., whether the cooling fan is operating properly). On the other hand, if the answer is NO, the system proceeds to the next step.

In Step S3, the system investigates whether the amount of cooling water supplied to the condenser 22 has decreased. If the answer is YES, a warning is issued in Step S8 and appropriate measures may be taken to increase the supply of cooling water from the cooling tower. Similarly, in the case that the condenser 22 is cooled using a fan unit, as a remedial measure, the power to the fan could be increased.

If the answer in Step S3 is still NO, the system checks whether on not the load on the system (i.e., the load to which the cooling liquid is circulated) has increased, and if so a warning is issued in Step S9 to investigate whether some reason exists to explain such an increase in load. If the load has been changed due to explainable changes in the environment in which the constant temperature liquid circulating apparatus is used, normal adjustments to the apparatus may simply be needed in order to maintain the desired constant temperature.

On the other hand, if the answers through Step S2 to Step S4 are all NO, the system determines that a relatively simple explanation for the rising trend in opening of the three-way proportional valve 46 does not exist, and it is judged that a more serious problem exists. In this case, a request is made in Step S5 to shut down the machinery for repairs, and in Step S6 a request is issued to service personnel or to a service facility, for effecting repairs to the apparatus, or replacement, as soon as possible. It should be noted, however, that in accordance with operation of the warning means 55, assuming that any of the answers in Steps S2 through S4 is YES, predictive warnings, that is, warnings which pre-estimate the cause of an improper operation before a serious malfunction or breakdown occurs, are issued, so that measures can be taken to prolong the service life and proper functioning of the apparatus without requiring a complete shutdown.

Some examples of other irregular conditions of the constant temperature liquid circulating apparatus which can be predicted from the outputs or variations in output of the aforementioned various sensors are as follows: 1) temperature data changes of refrigerant or condenser cooling water for predicting variations in cooling capacity, 2) changes in electrical current values of component motors for predicting motor life, 3) arrival at a limit value for the number of ON/OFF times of electromagnetic valves for predicting life expectancy of electromagnetic valves, 4) when the supply of electricity to heaters reaches a limiting value for predicting heater life, and 5) lowering of refrigerant pressure for predicting the generation of a gas leak.

In this manner, with the above-described predictive maintenance system, locations requiring maintenance, and maintenance time intervals therefor, are inferred before occurrence of a fault condition, and a report is issued to operators or service personnel beforehand, so that the fault or irregular operation does not occur. Therefore, the inventive system is different from so called after-event systems, in which an investigation of cause, exchange of parts and the like are made only after an irregular condition of the constant temperature liquid circulation apparatus occurs, so that the constant temperature liquid circulating apparatus and/or control devices attached thereto need not be completely stopped. Rather, the irregular condition can be predicted and parts can be repaired, and further, since the parts themselves which have the possibility for fault can be known as a result of reporting based on the output of operated sensors, the time needed for maintenance is also shortened and losses due to stoppage of the apparatus can be dramatically decreased.

Effect of the Invention. As described above, according to the predictive maintenance system of the present invention, in the above-described constant temperature liquid circulating apparatus, locations requiring maintenance and maintenance time intervals are inferred before the occurrence of a fault condition, so that the downtime of the apparatus can be reduced to a minimum. Furthermore, because a three-way proportional valve is used in place of an electromagnetic valve, a rise in the opening degree of the three-way proportional valve is used as an indicator of a reduction in cooling capacity, and thus indicates a need for maintenance. At the same time, there is no possibility of a "water hammer" effect, even when used with large capacity chiller apparatuses, and thus the present invention is applicable throughout a wide range of industrial environments.

What is claimed is:

1. A predictive maintenance system for a constant temperature fluid circulating apparatus, comprising:

a refrigeration circuit for cooling via a heat exchanger a cooling liquid which is circulated through a load;

a coolant circulating circuit, including a proportional valve and a heater disposed in a tank, for applying heat to and adjusting to a preset temperature the cooling liquid which has been cooled in said heat exchanger, and outputting said cooling liquid, wherein a constant temperature cooling liquid is circulated with respect to said load;

the system further comprising:

sensors for continuously monitoring, in respective parts of said constant temperature fluid circulating apparatus, various condition amounts, wherein parts requiring maintenance and maintenance time intervals are inferred from the condition amounts of the respective parts in the apparatus which are obtained as outputs from said sensors, said sensors including means for detecting a degree of opening of said proportional valve through which said cooling liquid is supplied to said tank in said cooling liquid circulating circuit; and warning means for issuing a warning before a breakdown or irregular operation occurs, when said degree of opening of said proportional valve exceeds a predetermined percentage.

2. The predictive maintenance system according to claim 1, wherein said proportional valve is a three-way proportional valve.

3. The predictive maintenance system according to claim 2, wherein said three-way proportional valve is disposed between an outlet of said heat exchanger and an inlet to said tank.

4. The predictive maintenance system according to claim 2, wherein the degree of opening of said three-way proportional valve fluctuates about an average value, and said means for detecting detects a rise in an average degree of opening of said proportional valve.

5. The predictive maintenance system according to claim 1, wherein, as sensors for continuously monitoring various condition amounts, sensors are disposed in said constant temperature fluid circulating apparatus for detecting changes in the condition amounts including temperature in respective parts, a current amount supplied to electromagnetic driving parts, a pressure of a refrigerant, and a flow amount of the cooling liquid, wherein said warning means senses parts requiring maintenance and maintenance time intervals and issues a warning based on a changes in condition amounts of respective parts in the apparatus which are obtained as outputs from said sensors.

6. The predictive maintenance system according to claim 1, wherein, as sensors for continuously monitoring various condition amounts, sensing means are provided in said constant temperature liquid circulating apparatus for detecting cumulative amounts of operating cycles of mechanical operating parts including valves and/or current supply time intervals to said heater, wherein said warning means senses parts requiring maintenance and maintenance time intervals and issues a warning based on changes in a condition amounts of respective parts in the apparatus which are obtained as outputs from said sensors.

* * * * *